(12) United States Patent
Aksu et al.

(10) Patent No.: US 8,092,667 B2
(45) Date of Patent: Jan. 10, 2012

(54) ELECTROPLATING METHOD FOR DEPOSITING CONTINUOUS THIN LAYERS OF INDIUM OR GALLIUM RICH MATERIALS

(75) Inventors: Serdar Aksu, Santa Clara, CA (US); Jiaxiong Wang, Castro Valley, CA (US); Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 639 days.

(21) Appl. No.: 12/143,609

(22) Filed: Jun. 20, 2008

(65) Prior Publication Data

US 2009/0315148 A1    Dec. 24, 2009

(51) Int. Cl.
*C23C 28/02* (2006.01)
*C25D 5/10* (2006.01)

(52) U.S. Cl. .......................... 205/184; 205/176

(58) Field of Classification Search .................. 205/170, 205/176, 184
See application file for complete search history.

(56) References Cited

U.S. PATENT DOCUMENTS

| | | | |
|---|---|---|---|
| 2,287,948 A | 6/1942 | Smart et al. | 204/45 |
| 2,409,983 A | 10/1946 | Martz et al. | 204/46 |
| 2,423,624 A | 7/1947 | Smart et al. | 204/45 |
| 2,458,839 A | 1/1949 | Dyer et al. | 204/45 |
| 2,497,988 A | 2/1950 | Green et al. | 204/45 |
| 3,812,020 A | 5/1974 | Vander Mey et al. | 204/24 |
| 4,581,108 A | 4/1986 | Kapur et al. | 204/37.1 |
| 4,798,660 A | 1/1989 | Ermer et al. | 204/192.17 |
| 4,915,745 A * | 4/1990 | Pollock et al. | 136/265 |
| 5,489,372 A * | 2/1996 | Hirano | 205/109 |
| 6,048,442 A | 4/2000 | Kushiya et al. | 204/192.28 |
| 2003/0230338 A1* | 12/2003 | Menezes | 136/265 |
| 2007/0232065 A1* | 10/2007 | Basol | 438/687 |

OTHER PUBLICATIONS

Calixto, M.E., et al., "CuInSe2 Thin films Formed by Selenization of Cu-In Precursors", *J. of Mat. Sci*, vol. 33, 1998, pp. 339-345.
Chen, J.S., et al., "Cu/In Deposited at Room Temperature: Morphology, Phases and Reactions", *Solar Cells*, vol. 30, 1991, pp. 451-458.
El Abedin, et al., "Electrodeposition of Selenium, Indium and Copper in an Air and Water Sable Ionic Liquid at Variable Temperatures", *Electrochimica Acta*, vol. 52, 2007, pp. 2746-2754.
Fritz, H.P, et al., "A New Electrochemical Method for Selenization of Stacked CuIn Layers and Preparation of CuInSe2 by Thermal Annealing", *Thin Solid Films*, vol. 247, 1994, pp. 129-133.
Kim, Y.H., et al., "Preparation of CuInSe2 Thin Films Using Electrodeposited In/Cu Metallic Layer", *IEEE*, 1994, pp. 202-205.
Lokhande, et al., "Preparation of CuInSe2 and CuInS2 Films by Reactive Annealing in H2Se or H2S", *Solar Cells*, vol. 21, 1987, pp. 215-224.
Valderrama, et al., "Electrodeposition of Indium onto Mo/Cu for the Deposition of Cu/In,Ga)Se2 Thin Films", *Electrochimica Acta*, vol. 53, 2008, pp. 3714-3721.
Walsh, et al., "The Electrodeposition of Indium", *Surface Technology*, vol. 8, 1979, pp. 87-99.
Zank, J., et al., "Electrochemical Codeposition of Indium and Gallium for Chalcopyrite Solar Cells", *Thin Solid Films*, vol. 286, 1996, pp. 259-263.

* cited by examiner

*Primary Examiner* — Edna Wong
(74) *Attorney, Agent, or Firm* — Pillsbury Winthrop Shaw Pittman LLP

(57) ABSTRACT

An electrochemical deposition method to form uniform and continuous Group IIIA material rich thin films with repeatability is provided. Such thin films are used in fabrication of semiconductor and electronic devices such as thin film solar cells. In one embodiment, the Group IIIA material rich thin film is deposited on an interlayer that includes 20-90 molar percent of at least one of In and Ga and at least 10 molar percent of an additive material including one of Cu, Se, Te, Ag and S. The thickness of the interlayer is adapted to be less than or equal to about 20% of the thickness of the Group IIIA material rich thin film.

9 Claims, 2 Drawing Sheets

US 8,092,667 B2

ELECTROPLATING METHOD FOR DEPOSITING CONTINUOUS THIN LAYERS OF INDIUM OR GALLIUM RICH MATERIALS

BACKGROUND

1. Field of the Invention

This invention relates to electroplating methods and solutions and, more particularly, to methods and electroplating solution chemistries for electrodeposition of Group IIIA-rich metallic thin films on a conductive surface for solar cell applications.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIA VIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIA VIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which includes a material in the family of $Cu(In,Ga,Al)(S,Se,Te)_2$, is grown over a conductive layer 13, which is previously deposited on the substrate 11 and which acts as the electrical contact to the device. Various conductive layers comprising Mo, Ta, W, Ti, and stainless steel etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. A variety of materials, deposited by a variety of methods, can be used to provide the various layers of the device shown in FIG. 1. It should be noted that although the chemical formula for a CIGS(S) layer is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In, Ga)(S,Se)_2$ means the whole family of compounds with Ga/(Ga+In) molar ratio varying from 0 to 1, and Se/(Se+S) molar ratio varying from 0 to 1.

One technique employed for growing $Cu(In,Ga)(S,Se)_2$ type compound thin films for solar cell applications is a two-stage process where at least two ingredients or elements or components of the $Cu(In,Ga)(S,Se)_2$ material are first deposited onto a substrate, and then reacted with S and/or Se in a high temperature annealing process. For example, for $CuInSe_2$ or CIS film growth, thin layers of Cu and In are first deposited on a substrate and then this stacked precursor layer is reacted with Se at elevated temperature to form CIS. If the reaction atmosphere also contains sulfur, then a $CuIn(S,Se)_2$ or CIS(S) layer can be grown. Addition of Ga in the precursor layer, i.e. use of a Cu/In/Ga stacked film precursor, allows the growth of a $Cu(In,Ga)(S,Se)_2$ or CIGS(S) absorber.

Sputtering and evaporation techniques have been used in prior art approaches to deposit the layers containing the Group IB and Group IIIA components of the precursor stacks. In the case of $CuInSe_2$ growth, for example, Cu and In layers were sequentially sputter-deposited on a substrate and then the stacked film was heated in the presence of gas containing Se at elevated temperature for times typically longer than about 30 minutes, as described in U.S. Pat. No. 4,798,660. More recently U.S. Pat. No. 6,048,442 disclosed a method comprising sputter-depositing a stacked precursor film comprising a Cu—Ga alloy layer and an In layer to form a Cu—Ga/In stack on a metallic back electrode layer and then reacting this precursor stack film with one of Se and S to form the absorber layer. Such techniques may yield good quality absorber layers and efficient solar cells, however, they suffer from the high cost of capital equipment, and relatively slow rate of production.

One prior art method described in U.S. Pat. No. 4,581,108 utilizes a low cost electrodeposition approach for metallic precursor preparation. In this method a Cu layer is first electrodeposited on a substrate. This is then followed by electrodeposition of an In layer and heating of the deposited Cu/In stack in a reactive atmosphere containing Se. Various other researchers have reported In electroplating approaches for the purpose of obtaining In-containing precursor layers later to be converted into CIS absorber films through reaction with Se (see for example, Lokhande and Hodes, Solar Cells, 21 (1987) 215; Fritz and Chatziagorastou, Thin Solid Films, 247 (1994) 129; Kim et al, Proceedings of the $1^{st}$ World Conf. on Photovoltaic Energy Conversion, 1994, p. 202; Calixto and Sebastian, J. Materials Science, 33 (1998) 339; Abedin et al., Electrochemica Acta, 52 (2007) 2746, and, Valderrama et al., Electrochemica Acta, 53 (2008) 3714).

A number of In electroplating baths used for depositing In layers on various conductive substrates have been disclosed in several references. For example, In plating baths containing sulfamate (U.S. Pat. No. 2,458,839), cyanide (U.S. Pat. No. 2,497,988), alkali hydroxides (U.S. Pat. No. 2,287,948), tartaric acid (U.S. Pat. No. 2,423,624), and fluoborate (U.S. Pat. No. 3,812,020, U.S. Pat. No. 2,409,983) have been developed. Some details on such chemistries may be found in the review paper of Walsh and Gabe (Surface Technology, 8 (1979) 87). Although it is possible to deposit In layers using various electroplating chemistries employing standard plating practices, unless these layers have sub-micron thickness and smooth morphology, they cannot be effectively used in thin film Group IBIIIA VIA compound solar cell fabrication.

As described above, one recent application of electroplated In films involves the formation of $Cu(In,Ga)(Se,S)_2$ or CIGS(S) films, which are the most advanced compound absorbers for polycrystalline thin film solar cells. An exemplary plating process includes first electroplating a thin In layer on a Cu layer, and then reacting this Cu/In precursor stack with Se to form a $CuInSe_2$, or a CIS absorber. Furthermore, to form a CIGS or CIGS(S) type of compound absorber, Ga can also be included in the precursor stack by plating it on the In layer or by including it in the In layer. Zank et al. (Thin Solid Films, 286 (1996) 259), for example, electrodeposited an In—Ga alloy layer on a Cu film forming a Cu/In—Ga precursor stack and then obtained a CIGS absorber layer by reacting the precursor stack with Se vapor. The CIGS absorber was then used to fabricate a thin film solar cell having a structure similar to the one shown in FIG. 1.

In a thin film solar cell employing a Group IBIIIA VIA compound absorber such as CIS or CIGS, the solar cell efficiency is a strong function of the molar ratio of the IB element (s) to IIIA element(s), i.e. the IB/IIIA molar ratio. If there are more than one Group IIIA materials in the composition, the relative amounts or molar ratios of these IIIA elements also affect the solar cell efficiency and other properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at or below 1.0. For ratios higher than 1.0, a low resistance copper selenide phase, which may introduce electrical shorts within the solar cells may form. Increasing the Ga/(Ga+In) molar ratio, on the other hand, widens the optical bandgap of the absorber layer, resulting in increased open circuit voltage and decreased short circuit current. A CIGS material with a Ga/(Ga+In) molar ratio higher than about 0.3 is electronically poor. It is for this reason that the sunlight-to-electricity conversion efficiency of a CIGS type solar cell first increases as the Ga/(Ga+In) molar ratio in the absorber is increased from 0 to 0.3, and then the efficiency starts to decrease as the molar ratio is further increased towards 1.

In light of the above discussion, it should be appreciated that if the electrodeposition process is used to introduce In into the composition of a CIGS(S) precursor material, it is essential that the electroplated In films have smooth morphology and uniform thickness, in micro-scale. If micro-structure of an In film or a In—Ga film electroplated on a Cu and optionally Ga containing precursor layer is rough and includes protrusions and valleys or discontinuities, the localized micro-scale Ga/(In+Ga) ratio at the protrusions would be lower than the Ga/(In+Ga) ratio at the valleys. Even the Cu/(In+Ga) molar ratio would be different at these two locations. As will be described next, this kind of micro-scale non-uniformity would yield a CIGS(S) absorber with non-uniform electrical and optical properties after reaction of the precursor stack with Se and/or S. The same argument also holds for the other thin film layers (such as Cu and Ga) within the precursor stack. However, electroplating a smooth Cu layer is relatively easy and the problem usually lies with Ga and In electrodeposition due to the tendency of these low melting, high surface tension elements forming droplets rather than continuous layers when deposited in thin film form.

Thin film CIGS(S) solar cell absorbers typically have a thickness range of 1000-3000 nm. The amount of In that needs to be included in such a thin absorber is equivalent to an In layer thickness which is in the range of about 200-700 nm. For example, for the formation of about 2000 nm thick CIGS absorber with a final Cu/(In+Ga) ratio of 0.85-0.9 and a Ga/(Ga+In) ratio of about 0.3, one needs to deposit about 250-300 nm thick Cu film, about 150 nm thick Ga layer and about 450-500 nm thick In film to form a precursor which may then be reacted with Se. Since cost lowering in CIGS solar cell fabrication as well as the need to reduce stress in the CIGS layer grown by the two-stage processes dictate the use of an absorber thickness which is in the range of 1000-1500 nm, the thickness of the In film in the above example gets reduced to about 200-300 nm level. The Ga layer thickness goes down even lower to the 75-100 nm range. Therefore, in a two stage CIGS(S) absorber formation approach employing an electroplated In layer, the electroplated In film thickness will have to be much less than 1000 nm, preferably less than 700 nm, most preferably less than 500 nm. This requirement presents many challenges for prior art In electroplating methods and chemistries. Although these issues will be discussed with respect to In electrodeposition, it should be understood that they are also applicable to Ga and In—Ga alloy electrodeposition.

Low melting Group IIIA materials such as In and Ga have high surface tension and they grow in the form of islands or droplets when deposited on a substrate surface in thin film form. This behavior has been observed in prior work carried out on electroplated In films (see for example, Chen et al., Solar Cells, 30 (1991) 451; Kim et al, Proceedings of the $1^{st}$ World Conf. on Photovoltaic Energy Conversion, 1994, p. 202; Calixto and Sebastian, J. Materials Science, 33 (1998) 339; Abedin et al., Electrochemica Acta, 52 (2007) 2746, and, Valderrama et al., Electrochemica Acta, 53 (2008) 3714), and in work carried out on In—Ga alloy films (see for example Zank et al., Thin Solid Films, 286 (1996) 259). As stated before, lack of planarity in sub-micron thick In and/or Ga-rich layers presents problems for application of such non-uniform layers to thin film solar cell manufacturing.

FIGS. 2A-2B schematically show a prior art structure in perspective and side views, respectively. The structure includes a typical prior art In layer 37, with sub-micron thickness which may be electrodeposited on a surface 36 of an under-layer 33. The under-layer 33 is formed over a base 30 having a substrate 31 and a contact layer 32. The under-layer 33 may, for example, include Cu and Ga and be formed on the contact layer 32. As can be seen from FIGS. 2A and 2B, the sub-micron thick In layer 37 is discontinuous and it includes islands 34 of In, separated by valleys 35 through which the surface 36 of the under-layer 33 is exposed. The width of the islands may be in the range of 500-5000 nm. If the structure of FIGS. 2A and 2B is reacted with a Group VIA material such as Se, a CIGS solar cell absorber 40 may be formed on the base 30 as shown in FIG. 3. The CIGS solar cell absorber 40 has compositional non-uniformities caused by the morphological non-uniformity of the sub-micron thick In layer 37. Accordingly, the CIGS solar cell absorber 40 has a first region 41 and a second region 42. The first region 41 corresponds to the islands 34 of In of the structure of FIG. 2A, and is an In-rich, Ga-poor region. The second region 42 corresponds to the valleys 35 of the structure of FIG. 2A, and is an In-poor, Ga-rich region. Furthermore, the Cu(In+Ga) molar ratio in the first region 41 is lower than the Cu(In+Ga) molar ratio in the second region 42. It should be appreciated that when a solar cell is fabricated on the CIGS solar cell absorber 40, the efficiency of the solar cell would be determined by both the first region 41 and the second region 42. The solar cell would act like two separate solar cells, one made on the first region 41 and the other made on the second region 42 and then interconnected in parallel. Since the Ga/(Ga+In) as well as the Cu/(In+Ga) molar ratios in the two regions are widely different the quality of the separate solar cells on these regions would also be different. The quality of the overall solar cell would then suffer from the poor I-V characteristics of the separate solar cells formed on either one of the first and second regions.

It should be noted that such non-uniformity problems may not be important in applications where the electroplated In layer is not used for the fabrication of an active electronic device such as a solar cell. It should also be noted that the In films when electrodeposited to thicknesses larger than about 1000 nm they may start forming continuous layers. In such cases the islands 34 in FIG. 2A grow horizontally as well as vertically and eventually merge, eliminating the valleys 35. However, such thick electroplated In layers are not useful for thin film solar cell fabrication since they yield CIGS absorbers that are too thick (thicker than about 3000 nm). Thick absorber layers cause excessive stress and delamination from the base. They also add to the cost of processing, which is not in line with the cost-lowering targets of thin film photovoltaics. Highly efficient CIGS solar cells can be fabricated on 1000 nm thick CIGS absorbers. Using a 3000 nm thick CIGS absorber in a solar cell structure increases materials usage three time and wastes effectively 67% of the materials used in forming the CIGS absorber structure.

As can be seen from the foregoing discussion it is necessary to develop new Group IIIA material electroplating approaches that can yield continuous layers at thicknesses less than about 700 nm, preferably less than about 500 nm. Such thin layers can be used in electronic and semiconductor applications such as in processing thin film CIGS type solar cells.

SUMMARY OF THE INVENTION

The present invention relates to electroplating methods and solutions and, more particularly, to methods and electroplating solution chemistries for electrodeposition of Group IIIA-material rich thin films on a conductive surface for solar cell applications.

In one aspect, the Group IIIA material rich thin film is deposited on an interlayer that includes 20-90 molar percent of at least one of In and Ga and at least 10 molar percent of an additive material including one of Cu, Se, Te, Ag and S. The thickness of the interlayer is adapted to be less than or equal to about 20% of the thickness of the Group IIIA material rich thin film.

In one preferred aspect there is provided a method of electrodepositing a Group IIIA material rich thin film over a surface of a base for manufacturing solar cell precursors, the method comprising: electrodepositing an interlayer over the surface of the base, wherein the interlayer comprises a predetermined molar percent of at least one of In and Ga and at least 10 molar percent of an additive material including one of Cu, Se, Te, Ag and S, wherein the predetermined molar percent is in the range of 20-90 percent; and electrodepositing the Group IIIA material rich thin film on the interlayer to a predetermined thickness, wherein the Group IIIA material rich thin film is one of a substantially pure In film, a substantially pure Ga film and a substantially pure In—Ga alloy, wherein the predetermined thickness of the Group IIIA material rich thin film is less than 700 nm, and wherein the thickness of the interlayer is less than or equal to 20% of the predetermined thickness.

In another preferred aspect there is provided a precursor layer structure for forming a Group IBIIIA VIA solar cell absorber that comprises a conductive base layer; an interlayer formed over the first layer, wherein the interlayer comprises a predetermined molar percent of at least one of In and Ga and at least 10 molar percent of an additive material including one of Cu, Se, Te, Ag and S, wherein the predetermined molar percent is in the range of 20-90 percent; and a Group IIIA material rich thin film formed on the interlayer layer to a predetermined thickness, wherein the Group IIIA material rich thin film is one of a substantially pure In film, a substantially pure Ga film and a substantially pure In—Ga alloy, wherein the predetermined thickness of the Group IIIA material rich thin film is less than 700 nm, and wherein the thickness of the interlayer is less than or equal to 20% of the predetermined thickness.

Other embodiments and aspects of the invention are described herein.

DETAILED DESCRIPTION OF THE INVENTION

The present invention provides a method for forming a Group IIIA material thin film on a conductive layer which is coated by an interlayer to facilitate a uniform Group IIIA material thin film growth with thickness less than about 700 nm. The Group IIIA material film, the interlayer and the conductive layer may be a part of a precursor stack that will eventually be reacted and transformed into a Group IBIIIA VIA solar cell absorber. The Group IIIA material thin film of the present invention may comprise any one of a substantially pure In material, a substantially pure Ga material, or an In—Ga binary alloy. The Group IIIA material thin film is a continuous film having a thickness less than about 700 nm. In one embodiment, the Group IIIA material thin film may be formed by an electrodeposition process on the surface of the interlayer. Accordingly, the interlayer of the present invention is formed on a conductive surface which may be the top surface of a base or a precursor stack. The group IIIA material thin film may then be formed by electrodeposition on the exposed surface of the interlayer. The interlayer comprises 20-90 molar percent, preferably 40-80 molar percent of at least one of In and Ga. The balance of the interlayer composition comprises an additive material. The additive material of the interlayer includes at least one of Cu, Se, Te, Ag and S, preferably at least one of Cu and Te. Other materials or impurities may also be present in the additive material as long as their molar content does not exceed about 10 molar percent of the total additive material composition. The process used to form the Group IIIA material thin film on the interlayer is electrodeposition; however, in the following description the words electroplating, plating and deposition may be used to refer to the electrodeposition process of the In and/or Ga layer.

An electrodeposition process of the present invention which forms a Group IIIA material layer, or thin film, for the manufacture of a Group IBIIIA VIA solar cell precursor structure will be described using FIGS. 4A-4C. FIG. 5 shows the structure with the Group IBIIIA VIA solar cell absorber, which is formed from the precursor stack of FIG. 4C.

Figure 1:
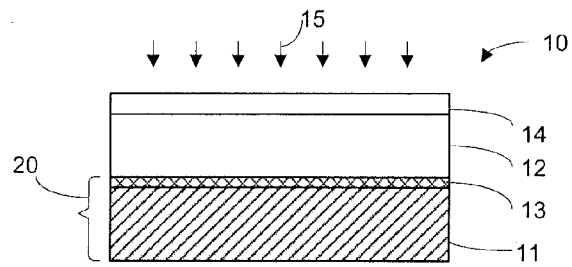
FIG. 1 is a schematic view of a prior art solar cell structure.
Figure 2A:
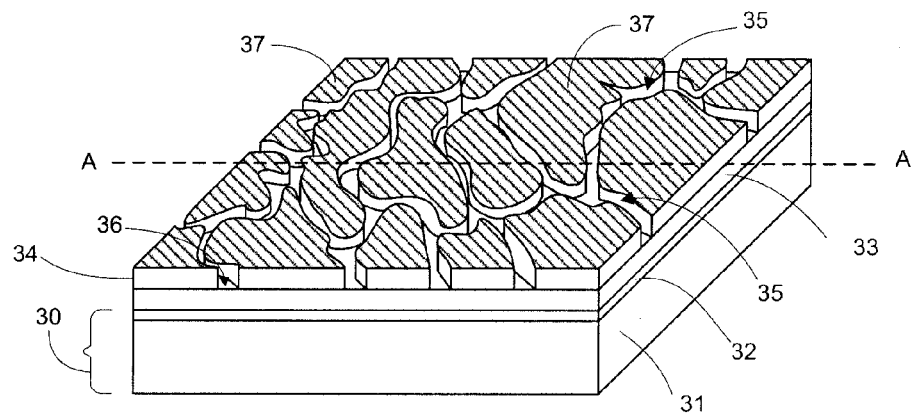
FIG. 2A is a perspective top view of a prior art precursor structure formed by electroplating a sub-micron thick In layer on a sub-layer.
Figure 2B:
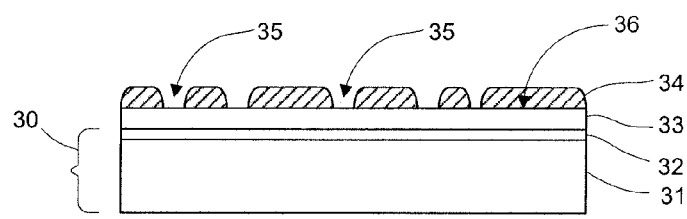
FIG. 2B is a cross-sectional view of the structure of FIG. 2A taken along the line AA.
Figure 3:
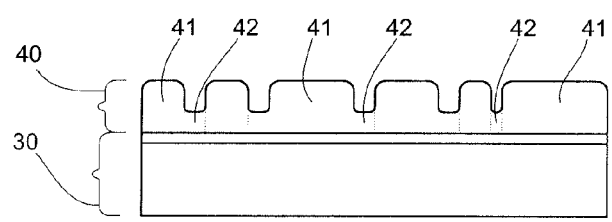
FIG. 3 is a CIGS layer formed after reaction of the structure of FIG. 2B with Se.
Figure 4A:
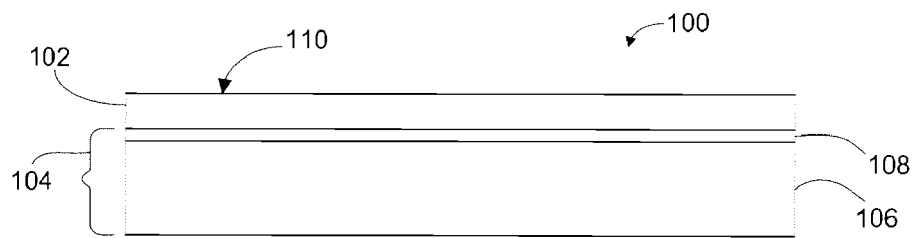
FIGS. 4A-4C schematically shows electrodeposition of a uniform In-rich layer over a continuous interlayer thus forming a uniform stack.
Figure 5:
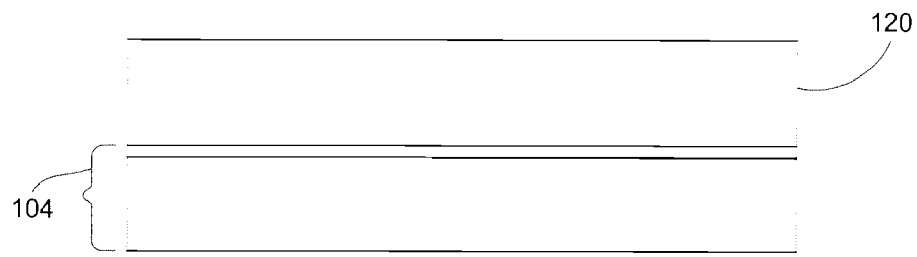
FIG. 5 shows a Group IBIIIA VIA compound layer formed on a base using the stack of FIG. 4.

FIG. 4A exemplifies a first structure 100 including a first layer 102 formed on a base 104 to initiate the precursor stack forming process of the present invention. The first layer 102 may preferably be formed using an electrodeposition process; however, other deposition processes such as evaporation, sputtering and the like may also be used to form the first layer 102. The base 104 may be a conductive base including a substrate 106 and a contact layer 108, which will eventually form an electrical contact to the CIGS(S) absorber after the reaction step. The substrate 106 may be a continuous conductive material such as a metal or alloy foil, preferably a stainless steel foil. The contact layer 108 may comprise conductive materials such as Mo, W, metal nitrides, Ru, Os, and Ir, which make ohmic contact to CIGS(S) type absorber films. The first layer 102 is a conductive layer comprising Cu. The first layer 102 may be a pure Cu layer or it may comprise In and/or Ga. The first layer 102 may be homogeneous or it may be in the form of a stack. Exemplary stacks forming the first layer 102 include, but are not limited to, Cu/Ga, Cu/Ga/Cu, Cu—Ga/Cu, and the like, stacks.

Figure 4B:
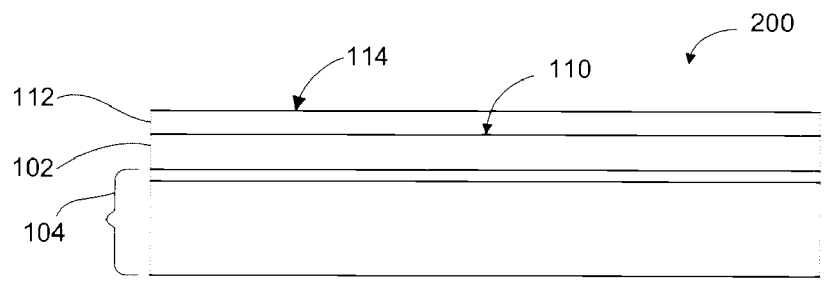

FIG. 4B shows a second structure 200 formed as the process of the present invention proceeds. In the second structure 200, a second layer 112 or an interlayer is formed on the top surface 110 of the first layer 102, using preferably an electrodeposition process. The interlayer 112 is a conditioned conductive layer so that it establishes a conditioned surface for the following Group IIIA thin film deposition. In the context of this application, the word conditioned refers to establishing a material composition that not only helps forming a thin and continuous Group IIIA layer on the interlayer but also includes constituents that do not affect negatively the overall composition of the resulting precursor stack and do not deteriorate the quality of the CIGS(S) absorber to be formed. The interlayer 112 is a continuous layer with a substantially uniform thickness which is less than 100 nm, preferably less than 50 nm. Surface 114 of the interlayer 112 functions as an active deposition site to allow a Group IIIA material to continuously and uniformly deposit onto the surface 114 in the subsequent step, thereby eliminating the discontinuity problems of the prior art described above.

The interlayer 112 comprises 20-90 molar percent, preferably 40-80 molar percent of at least one of In and Ga. Presence of In and/or Ga in the interlayer composition is important for the interlayer to provide effective nucleation to the In and/or Ga rich layer that will be electroplated on top of it. However, the In and/or Ga content of the interlayer cannot be more than 90% because the interlayer needs to be continuous to be able to provide the effective nucleation sites. If the interlayer becomes near pure In and/or Ga layer then it would be in the form of islands or droplets as discussed before.

Besides In and/or Ga, the balance of the interlayer composition is an additive material. The additive material in the interlayer includes at least one of Cu, Se, Te, Ag and S. The most preferred additives are Cu and Te. These additives assist in making the interlayer a continuous film, and at the same time the In and/or Ga in the interlayer provide high density of nucleation sites for the In and/or Ga layer that would be electroplated on the interlayer. Since the invention specifically targets Group IBIIIA VIA absorber layer (compound layer) fabrication, the additive materials are the materials that will not damage the electronic quality of the CIGS(S) absorber. Other materials or impurities may also be present in the additive material without exceeding about 10 molar percent of the total additive material composition. Examples of such impurities include Sb and As. The composition of the interlayer is largely determined by the chemical composition of the Group IIIA material layer (layer 116 in FIG. 4C) that will be electrodeposited onto the interlayer 112 and any other layer that may be present in the resulting precursor stack.

In one embodiment, the interlayer 112 may be electrodeposited out of plating electrolytes comprising at least one of In and Ga as well as at least one additive such as Cu and Te. By co-depositing these additives and including them into the interlayer 112, a continuous interlayer may be obtained even at a thickness as low as 10 nm. Although the thickness of the interlayer 112 depends on the thickness of the Group IIIA material layer that will be electrodeposited onto the interlayer, a preferable thickness of it may be for example less than about 50 nm so that the amount of In, Ga and other materials that it may contain do not become a determining factor in the overall composition, i.e. the Cu/(In+Ga) molar ratio or Ga/(Ga+In) molar ratio, of the resulting structure after the Group IIIA material deposition. In one embodiment, the thickness of the interlayer is less than or equal to about 20%, preferably less than about 10% of the thickness of the Group IIIA material-rich layer that is deposited over the interlayer, so that the effect of the interlayer on determining the overall composition of the resulting precursor stack is limited. This is important for manufacturability and repeatability of the process.

Figure 4C:
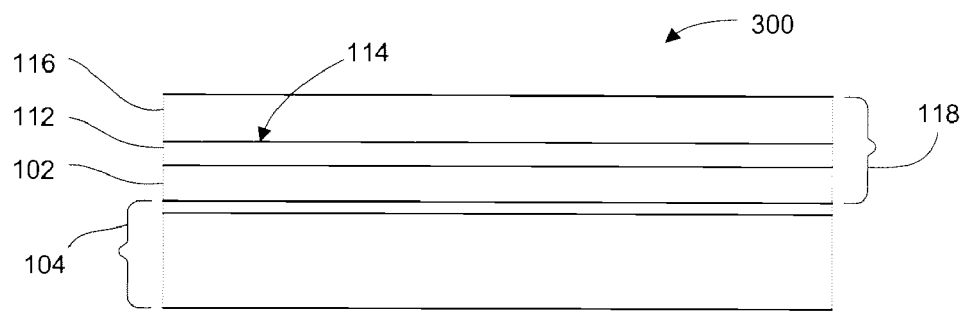

FIG. 4C shows a third structure 300 formed after electrodepositing a third layer 116 which is a substantially pure Group IIIA material layer onto the interlayer 112. As opposed to the discontinuity problems of the prior art In and/or Ga films, the third layer 116 is a continuous thin film. By employing an electrodeposition process that uses the interlayer 112 of the present invention as a cathode, very thin Group IIIA material layers having uniform thickness may be formed on the interlayer 112. The thickness of the third layer 116 may be less than about 700 nm, preferably less than about 500 nm, whereas the thickness of the interlayer is less than about 20% of these values, i.e. less than about 140 nm, preferably less than about 100 nm. Most preferably the thickness of the interlayer is less than about 10% of the thickness of the third layer 166, i.e. less than about 70 nm. In one embodiment, the Group IIIA material deposited on the interlayer may be a substantially pure In—Ga binary alloy electrodeposited from an electrolyte comprising In and Ga ions. During the electrodeposition process, in an electrodeposition chamber containing the electrodeposition electrolyte, the interlayer 112 is cathodically polarized with respect to an anode so that the third layer comprising In and Ga deposits onto the surface 114 of the interlayer in a uniform manner. The chemical composition of the third layer 116 may preferably comprise at least 90 molar percent In and/or Ga, preferably at least 95 molar percent In and/or Ga.

Referring back to FIG. 4C, as will be appreciated, in the third structure 300, the stack of the first layer 102, the second layer 112 or interlayer and the third layer 116 forms a precursor stack containing Group IB and Group IIIA elements on the base 104.

As shown in FIG. 5, in the following process step, the precursor stack 118 is reacted with at least one Group VIA material such as Se, Te or S to form an absorber layer 120 on the base 104. As mentioned above the precursor stack 118 comprises Cu, In, and Ga, and therefore reacting them with a Group VIA material forms the absorber 120 which is a compositionally uniform Group IBIIIA VIA compound layer.

Although the present invention is described with respect to certain preferred embodiments, modifications thereto will be apparent to those skilled in the art.

We claim:

1. A method of electrodepositing a thin and continuous Group IIIA material rich thin film over a surface of a base for manufacturing solar cell precursors, the method comprising:

forming a first layer on the surface of the base, wherein the first layer includes at least one of Cu and Ga;

after forming the first layer, electrodepositing an interlayer on a surface of the first layer, wherein the interlayer comprises a predetermined molar percent of at least one of In and Ga and at least 10 molar percent of an additive material including one of Cu, Se, Te, Ag and S, wherein the predetermined molar percent of the at least one of In and Ga is in the range of 20-90 percent, wherein the interlayer is a conditioned conductive layer that assists in forming the thin and continuous Group IIIA material rich film that is subsequently deposited and provides effective nucleation sites for the thin and continuous Group IIIA material rich film that is subsequently deposited; and electrodepositing the thin and continuous Group IIIA material rich thin film on the interlayer to a predetermined thickness, wherein the thin and continuous Group IIIA material rich thin film is one of a substantially pure In film, a substantially pure Ga film and a substantially pure In—Ga alloy, wherein the predetermined thickness of the thin and continuous Group IIIA material rich thin film is less than 700 nm, and wherein the thickness of the interlayer is less than or equal to 20% of the predetermined thickness.

2. The method of claim 1, wherein the predetermined molar percent of the interlayer is in the range of 40-80 percent, and the interlayer composition comprises 20-60 molar percent of the additive material.

3. The method of claim 2, wherein the interlayer comprises 40-80 molar percent In, and the balance at least one of Cu and Te.

4. The method of claim 3, wherein the thickness of the interlayer is less than 10% of the predetermined thickness.

5. The method of claim 4 further comprising reacting the first layer, the interlayer and the thin and continuous Group IIIA material rich thin film to form a Group IBIIIA VIA solar cell absorber.

6. The method of claim 5 wherein the predetermined thickness of the thin and continuous Group IIIA material rich thin film is less than 500 nm and a thickness of the interlayer is less than 50 nm.

7. The method of claim 1 further comprising reacting the first layer, the interlayer and the thin and continuous Group IIIA material rich thin film to form a Group IBIIIA VIA solar cell absorber.

8. The method of claim 7 wherein the predetermined thickness of the thin and continuous Group IIIA material rich thin film is less than 500 nm and a thickness of the interlayer is less than 50 nm.

9. The method of claim 1 wherein the predetermined thickness of the thin and continuous Group IIIA material rich thin film is less than 500 nm and a thickness of the interlayer is less than 50 nm.

* * * * *